United States Patent [19]
Rutigliano

[11] Patent Number: 5,813,876
[45] Date of Patent: Sep. 29, 1998

[54] PRESSURE ACTUATED ZERO INSERTION FORCE CIRCUIT BOARD EDGE CONNECTOR SOCKET

[75] Inventor: Michael L. Rutigliano, Chandler, Ariz.

[73] Assignee: Intel Corporation, Santa Clara, Calif.

[21] Appl. No.: 662,887

[22] Filed: Jun. 13, 1996

[51] Int. Cl.[6] .................................................. H01R 13/15
[52] U.S. Cl. ............................................................ 439/260
[58] Field of Search ............................... 439/42, 67, 197, 439/260, 267, 493

[56] References Cited

U.S. PATENT DOCUMENTS

| | | |
|---|---|---|
| 3,795,888 | 3/1974 | Nardo et al. . |
| 4,060,295 | 11/1977 | Tomkiewicz . |
| 4,542,950 | 9/1985 | Gillett et al. . |
| 4,629,270 | 12/1986 | Andrews, Jr. et al. . |
| 4,648,668 | 3/1987 | Sinisi . |
| 5,061,192 | 10/1991 | Chapin et al. . |
| 5,071,357 | 12/1991 | Van Brunt, Jr. et al. . |
| 5,102,343 | 4/1992 | Knight et al. . |
| 5,137,461 | 8/1992 | Bindra et al. . |
| 5,147,208 | 9/1992 | Bachler ..................................... 439/67 |
| 5,181,853 | 1/1993 | Van Brunt, Jr. et al. . |
| 5,185,073 | 2/1993 | Bindra et al. . |
| 5,222,668 | 6/1993 | Frankeny et al. ....................... 439/197 |
| 5,228,862 | 7/1993 | Baumberger et al. . |
| 5,230,632 | 7/1993 | Baumberger et al. . |
| 5,237,743 | 8/1993 | Busacco et al. . |
| 5,409,392 | 4/1995 | Marks et al. . |

*Primary Examiner*—Gary F. Paumen
*Assistant Examiner*—Yong Ki Kim
*Attorney, Agent, or Firm*—Blakely, Sokoloff, Taylor & Zafman

[57] ABSTRACT

An electrical connector for establishing an interconnection between the contact pads of a printed circuit board and an electrical device. The connector includes a flexible circuit that is capable of being electrically coupled to a tester, driver, or some other external electrical device. The flexible circuit has a first side and an opposite second side and includes at least one metal layer and a plurality of electrically conductive contact bumps that are attached to and protrude from the metal layer along the first side. An expandable bladder is positioned adjacent the flexible circuit and exerts a force against the second side of the flexible circuit to cause the contact bumps to physically engage with the contact pads of the printed circuit board. A gas cylinder, pump, air compressor or other fluid pressure source is operatively coupled to the bladder for causing expansion of the bladder to effect the engagement of the contact bumps of the flexible circuit with the contact pads of the printed circuit board.

4 Claims, 10 Drawing Sheets

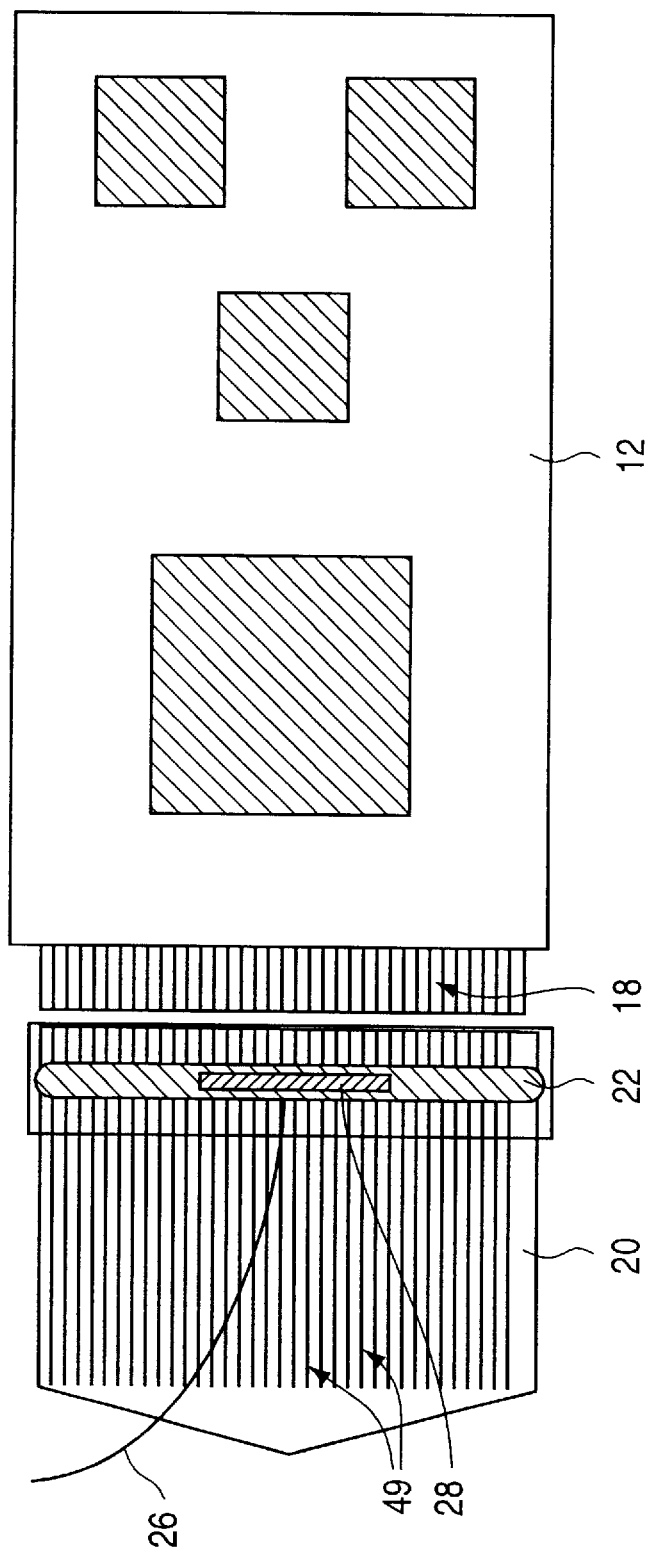

PRESSURE ACTUATED ZERO INSERTION FORCE CIRCUIT BOARD EDGE CONNECTOR SOCKET

FIELD OF THE INVENTION

The present invention relates to electrical connectors and more particularly to fluid pressure actuated connectors for electrically connecting printed circuit boards and the like.

BACKGROUND OF THE INVENTION

During the post-manufacture of semiconductor devices and printed circuit boards, the components (whether they be individual intergrated circuit devices or circuit boards containing integrated circuit devices) are subjected to a reliability test called "burn-in" prior to their shipment. The burn-in test is a functional test subjecting all the components mounted on a circuit board to a temperature and voltage condition for the purpose of separating the good product from the bad. In addition, IC chips and circuit boards often undergo functionality, performance, and/or failure analysis testing during the manufacturing or post manufacturing of such devices.

Electrical connectors for interconnecting circuit boards to testers and drivers are known in the art. Typically, such connectors possess contacting elements that extend from the connector to effect contact with respective contact pads (e.g., flat copper pads) located on an external surface of the printed circuit board. Contact is usually achieved through the use of some compression or clamping means that engages the contact elements with their respective contact pads. Zero insertion force (ZIF) card edge connectors are also known in the art and are used to overcome those problems associated with high insertion forces. One type of zero insertion force connector utilizes fluid pressure to actuate an expandable bladder located within a housing of the connector to exert a force against a flexible circuit. Electrical connection between the connector and circuit board is achieved by expanding the bladder to forcibly engage contact elements/pads on the surface of the flexible circuit with corresponding pads on the edge of the printed circuit board.

Although the use of pressure actuated zero insertion force connectors are known in the art, there are several problems that have yet to be overcome by current zero insertion force connector designs. Notably, during the manufacturing process debris and other contaminates accumulate and adhere to the external printed circuit board contact pads. Current pressure actuated zero insertion force sockets fail to account for the removal of debris, contaminates or other non-conductive layers that tend to form on the surface of external printed circuit board contacts.

As described above, fluid pressure actuated zero insertion force connectors typically use an expandable bladder to exert a force against a flexible circuit to thereby engage the contact pads of the flexible circuit with corresponding contact pads located on the printed circuit board. Although prior art fluid pressure actuators adequately address those problems associated with excessive insertion force, they do not adequately assure the complete disengagement of the connector contact elements from the printed circuit board contact pads prior to the removal of the circuit board from the connector. As a result, the life of the connector contact elements are effectively reduced as they drag or scrape against the circuit board contact pads during the removal of the circuit board from the connector. Moreover, the dragging or scraping of the connector contact elements tend to cause excessive wear or damage to the printed circuit boards contact pads.

Thus, what is needed is a method and apparatus for electrically coupling a printed circuit board to another electrical device, such as a tester, that solves the problems associated with current fluid pressure zero insertion force connectors.

SUMMARY OF THE INVENTION

The present invention is an electrical connector for establishing an electrical connection between the contact pads of a printed circuit board and an electrical device. The connector includes a flexible circuit that is capable of being electrically coupled to a tester, driver, or some other external electrical device. The flexible circuit has a first side and an opposite second side and includes at least one metal layer and a plurality of electrically conductive contact bumps that are attached to and protrude from the metal layer along the first side. An expandable bladder is positioned adjacent the flexible circuit and exerts a force against the second side of the flexible circuit to cause the contact bumps to physically engage with the contact pads of the printed circuit board. A gas cylinder, pump, air compressor or other fluid pressure source is operatively coupled to the bladder for causing expansion of the bladder to effect the engagement of the contact bumps of the flexible circuit with the contact pads of the printed circuit board.

BRIEF DESCRIPTION OF THE DRAWINGS

The present invention is illustrated by way of example and is not limited by the figures of the accompanying drawings, in which like references indicate similar elements, and in which:

FIG. 2 illustrates a top view of the electrical connector shown in FIGS. 1A and 1B.

DETAILED DESCRIPTION

An apparatus and method that provides an electrical connection between a test apparatus, or other electrical device, and the contact pads of a printed circuit board is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

Figure 1A:
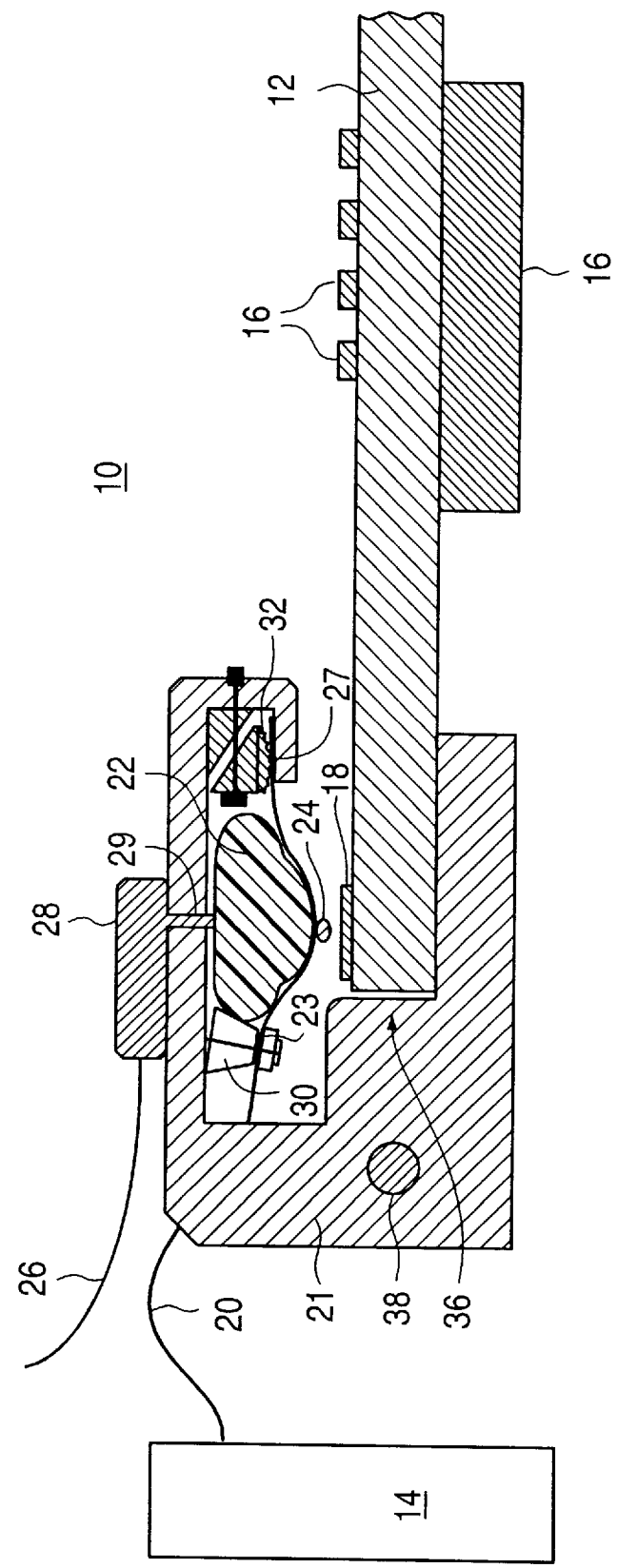
FIG. 1A illustrates a side view of an electrical connector/socket of one embodiment of he present invention in a disengaged position.

FIG. 1A illustrates an electrical connector/socket 10 of one embodiment of the present invention in a disengaged state. Connector 10 is used to electrically couple a printed circuit board (PCB) 12 with another electrical device 14 as shown in FIG. 1A. Electrical device 14 may be a tester, driver, communication equipment, etc.. Board 12 typically comprises a composite of organic and inorganic materials with external and internal wiring, allowing electronic components 16 to be mechanically supported and electrically connected. A typical PCB contains at least one metal layer that is patterned to transfer signals between electronic components, one power plane for distributing voltage throughout the PCB, and one ground plane. Conductive paths connect the respective metal layers to contact pads 18 positioned along an edge of the board.

Connector 10 includes a support frame/housing 21 with an opening that accommodates the insertion of PCB 12, or a similar device, into the housing chamber. In order to accomplish electrical interconnection between PCB contact pads 18 and electrical device 14, connector 10 utilizes a flexible circuit 20. Flexible circuits are known in the art and typically include a thin dielectric (e.g., polyimide) substrate of relatively thin construction with conductive circuitry disposed on at least one surface thereof. One of the salient feature of the present invention lies in the use of an electrically conductive contact element 24 that is attached to the conductive circuitry or metal layer(s) of the flexible circuit. As shown in FIG. 1A, contact element 24 protrudes from one side of the flexible circuit 20 and is aligned over contact pads 18 when PCB 12 is positioned within the connector housing 21. Flexible circuit 20 is coupled to electrical device 14 at one end and is secured within the connector housing at first and second sections 23 and 27 along its other end. Section 27 is fixed within the housing and may be retained by a wedge clamp 32 or other clamping device. Section 23 is attached to a pivot clamp 30 which allows flexible circuit 20 to move within housing 21 to effect the engagement of elements 24 with contact pads 18 of PCB 12. Housing 21 also contains a pivot 38 that facilitates the alignment of connector 10 and PCB 12 during the initial insertion and the subsequent engagement of the PCB with the connector. A hardstop 36 is provided within housing 21 to aid in the alignment of the PCB contacts 18 and flexible circuit contact elements 24. Further alignment may be achieved by an alignment means comprising a pin that is secured to the hardstop and projects therefrom for aligning with and being inserted within a corresponding aperture located within the PCB. A slot and recess arrangement, or any of a number of other alignment means known in the art, may also be used to effect proper alignment between connector 10 and PCB 12. Additionally, an optical sensor or mechanical microswitch may be attached to or integrally formed within hardstop 36 to detect the presence, or the absence thereof, of a PCB within the socket.

Figure 1B:
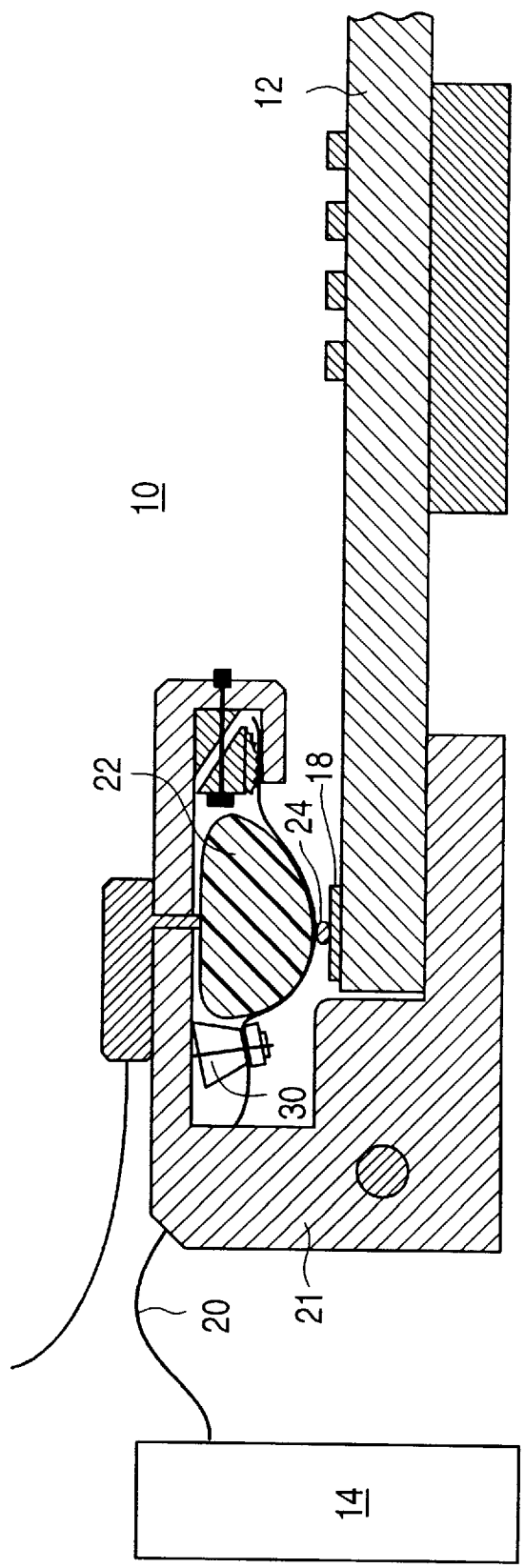
FIG. 1B illustrates the connector of FIG. 1A with the contact elements of the connector engaged with the contact pads of a printed circuit board.

An expandable bladder 22 is provided within housing 21 and is positioned between an internal wall of housing 21 and the backside of flexible circuit 20 between sections 23 and 27. Bladder 22 is coupled to a fluid pressure source through tubing 26, manifold 28 and passage 29. The contact elements 24 of flexible circuit 20 are physically engaged with the contact pads 18 of PCB 12 by a force exerted by the expansion of bladder 22. It is understood that the application of fluid pressure results in a uniform application of force to all internal surfaces of bladder 22. As a result, the invention is able to use this uniformity of pressure application to assure a good effective contact between contact elements 24 and contact pads 18. FIG. 1B shows connector 10 in a fully engaged position wherein contact elements 24 of flexible circuit 20 are physically engaged with contact pads 18 of PCB 12. Note that the pivotal attachment of flexible circuit 20 at pivot clamp 30 provides a wiping motion that causes contact elements 24 to mechanically scrub pads 18 as the contact elements physically engage the PCB contact pads. In this manner, the connector is capable of assuring removal of debris or other contaminates, such as an oxidation or other insulation layer, from the PCB contact pads to ensure a reliable electrical connection.

Housing 21 is preferably molded of an electrically insulative material, such as plastic. In one embodiment of the invention, housing 21 is of a rectangular configuration having planar internal and external surfaces as illustrated in FIGS. 1A and 1B. In one example of the invention, housing 21 possesses an overall height and side width of about 0.75 inches, respectively, and an overall length of about 5.0 inches.

FIG. 2 illustrates a top view of the connector 10 and PCB 12 of FIGS. 1A and 1B prior to the insertion of the PCB into the connector assembly. As shown in FIG. 2, PCB 12 generally includes a plurality of contact pads 18 that are formed on a facing external surface along an edge of the board. Contact pads 18 comprise an electrically conductive material such as copper having a thickness of approximately 0.001 inch. The contact pads may include additional metal layers such as nickel and gold for better conductivity and corrosion protection. The contact pads generally possess a rectangular configuration with a width and length of about 0.05 and 0.075 inches, respectively. Center-to-center spacing is about 0.05 inches. The contact pads may be of substantially larger or smaller dimensions depending upon the particular application.

In one embodiment of the invention, flexible circuit 20 includes a dielectric substrate having a thickness in the range of about 0.002 to about 0.005 inches. Flexible circuit 20, as shown in FIG. 2, includes conductive circuitry 49 represented by individual conductive lines formed on the outer surface of a dielectric substrate. It is appreciated that the conductive circuitry may also include printed circuitry similar to that used in printed circuit boards. The flexible circuit is generally formed by laminating a polyimide substrate with a copper foil having a thickness of approximately 0.001 to 0.002 inches. The copper foil is typically laminated onto the polyimide substrate using an epoxy-based adhesive. A photolithographic technique is used to create the specific circuit pattern. A second polyimide layer may be applied as a protective layer over the circuitry. Note that in lieu of the polyimide substrate, any of another of dielectric films or tapes may be used in the fabrication of the flexible circuit. Moreover, it is appreciated that the flexible circuit is not limited to a copper foil and laminate type of construction. For example, flexible circuit 20 may comprise a plurality of spaced-apart copper wires that are affixed to a flexible dielectric substrate. Contact elements 24 are attached or formed onto conductive circuitry 49, and are used to effect an electrical connection between circuitry 49 and contact pads 18 of PCB 12.

Figure 3A:
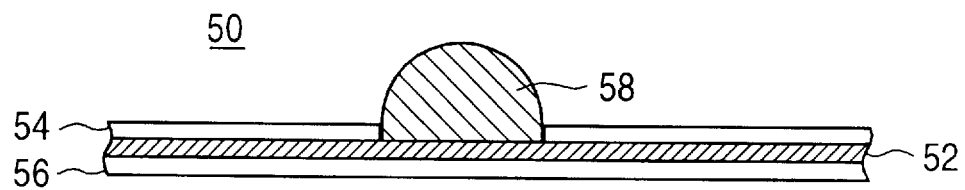
FIG. 3A illustrates a flexible circuit of one embodiment of the present invention having an electrically conductive contact element attached to a metal layer and protruding from one side of the flexible circuit.

With reference to FIG. 3A, a side-view of a flexible circuit 50 of one embodiment of the present invention is shown. As illustrated, flexible circuit 50 includes a single conductive layer 52 that is sandwiched between two dielectric layers 54 and 56. As previously discussed, dielectric layers 52 and 54 may comprise a polyimide tape, each having a thickness of approximately 0.005 inches. Conductive layer 52 represents a portion of the flexible circuit circuitry and may comprise a copper foil having a thickness of approximately 0.001 to 0.002 inches. A contact bump/element 58 is attached to conductive layer 52 and protrudes from a side 51 of flexible circuit 50. Flexible circuit 50 generally includes a plurality of contact elements 58 disposed along one side of the circuit that are aligned in a corresponding relationship with the contact pads of a PCB. Contact element 58 is a conductive metal or metal alloy that possess a relatively high tensile strength such as beryllium-copper or a similar metallic material. Contact element 58 typically has a diameter of approximately one half the width of its corresponding PCB contact pad. As an example, in an embodiment wherein the contact pad of a printed circuit board has a width of 0.050 inches, the diameter of contact element 58 is approximately 0.025 inches. Contact elements 58 may be formed and/or attached to the flexible circuit conductive layer 52 in a variety of ways. One method includes positioning a beryllium-copper sphere or cylinder adjacent an exposed portion of conductive layer 52 and reflowing the sphere to form a bump as depicted in FIG. 3A. In one embodiment, the beryllium-copper sphere comprises 1.80 to 2.05 percent beryllium by weight. The flexible circuit conductive layer 52 may be exposed by etching, laser cutting, punching or drilling holes within dielectric layer 54. Pursuant to one method, the beryllium-copper spheres are attached to the conductive layer by applying a resin flux and solder paste to the exposed portions of the conductive layer, positioning beryllium-copper spheres onto the exposed regions, and running the unit through a reflow furnace. In lieu of using a flux, a separate support structure may be used to hold the beryllium-copper spheres in place during the reflow process. Electroplating, sputter deposition and other processes known in the art may be used to form contact elements 58.

Figure 3B:
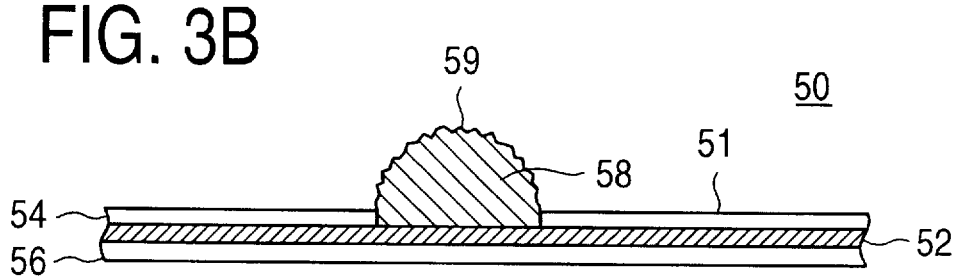
FIG. 3B illustrates the contact element of FIG. 3A having a textured surface that enhances the mechanical scrub capability of the contact element.

To enhance the mechanical scrub capabilities of contact element 58, the surface of the contact element may be textured in a manner similar to that illustrated in FIG. 3B. The surface, or a portion thereof, of contact element 58 may be textured by any of a number of methods. One method includes patterning a photoresistive layer on the side surface 51 of dielectric layer 54 and utilizing an etch-back process to form crevices within the contact element surface. When the etch-back process is complete, the photoresistive layer is removed from the surface/side of the flexible circuit.

In accordance with the present invention, the contact elements 58 of flexible circuit 50 are adapted to engage with the contact pads of a PCB when a force is applied to the backside 57 of the flexible circuit. Turning again to FIG. 1A, an expandable bladder 22 is provided within connector 10 to exert a force against the backside of flexible circuit 20. The expandable bladder, as used in one embodiment of the invention, comprises a polyurethane or silicon rubber material and possesses a sidewall thickness within the range of 0.002 to 0.020 inches. Bladder 22 may comprise pre-formed tubing or alternatively shaped expandable chambers. The length and diameter of bladder 22 varies depending upon the specific application. Bladder 22 may have a length and diameter of approximately 5.0 and 0.25 inches, respectively. In one embodiment, bladder 22 is coupled to a fluid pressure source through tubing 26, manifold 28 and passage 29. The fluid pressure source may include an air compressor, pump, pressurized gas cylinder, etc.. Tubing 26 may include silicone rubber, Teflon or any other material suitable for transporting pressurized gas, pneumatic or hydraulic fluids. This may include small capillary tubing having a diameter of 0.0625 to 0.125 inches. Tubing 26 is attached to manifold 28 that directs air to a passage 29 or a plurality of passages formed within housing 21. Manifold 28 may comprise aluminum or any other material that is suitable for containing a pressurized gas or hydraulic fluid. It is important to note, however, that the use of a manifold is not necessary to implement the present invention. In one embodiment, a fluid pressure may be supplied to one or both ends of the expandable bladder. In yet another embodiment of the present invention, tubing 26 may be coupled to a vacuum pump. Pursuant to this embodiment, a vacuum may be drawn on bladder 22 to cause the bladder to contract to effect a complete disengagement of the flexible circuit contact elements 24 from the PCB contact pads 18 before the circuit board is withdrawn from the connector. In order to ensure a complete withdrawal of contact elements 14 from contact pads 18, flexible circuit 20 may be secured to bladder 22 by applying an epoxy/silicone adhesive to the backside of the flexible circuit at points, or along a line, opposite contact elements 24.

Figure 4A:
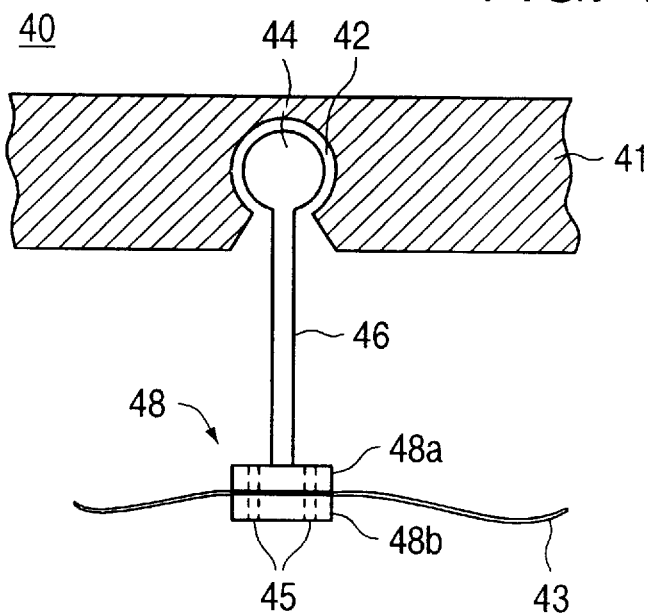
FIG. 4A illustrates a side view of a pivot clamp that may be used in the implementation of the present invention.
Figure 4B:
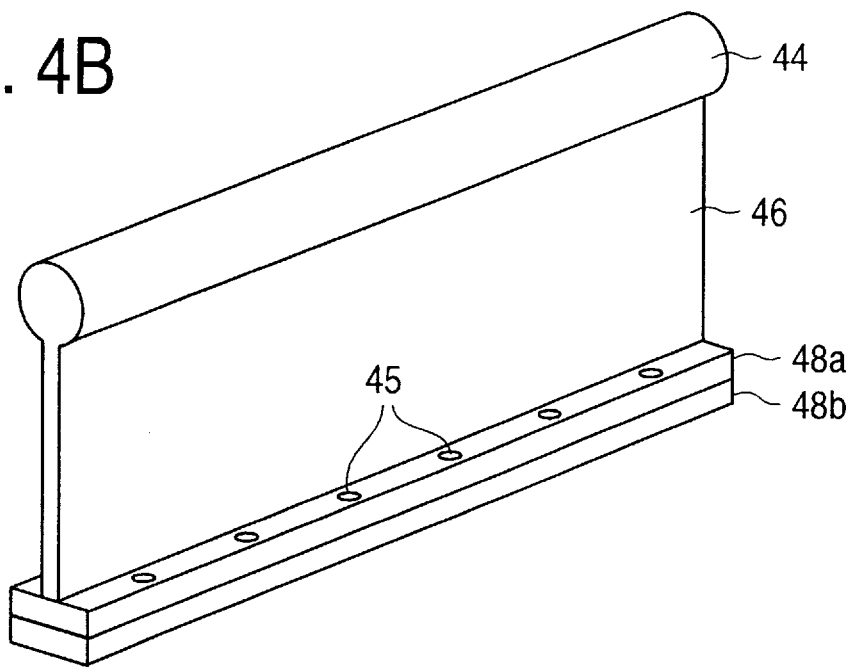
FIG. 4B illustrates a perspective view of the pivot clamp shown in FIG. 4A.

With continuing reference to FIGS. 1A and 1B, flexible circuit 20 is shown secured within connector housing 21 at first and second sections 23 and 27, respectively. As previously discussed, section 27 is fixed while section 23 is attached to a pivot clamp 30. As noted above, the pivotal arrangement allows flexible circuit 20 to move within housing 21 to effect the engagement of contact elements 24 with circuit board contact pads 18. More importantly, the pivotal attachment of flexible circuit at pivot clamp 30 provides a wiping motion that causes contact elements 24 to mechanically scrub pads 18 as the contact elements physically engage the PCB contacts. FIG. 4A shows a side view of a pivot clamp assembly 40 in one embodiment of the present invention. Assembly 40 includes a clamp 48, arm 46 and cylindrical pivot member 44. Pivot member 44 resides within a cylindrical cavity 42 formed within a wall of the connector housing 41. Cavity 42 has a slightly larger diameter than pivot member 42. Clamp 48 includes a first member 48a that is attached to pivot arm 46, and a second member 48b. The flexible circuit 43 is secured to the pivot arm assembly 40 by clamping the circuit between the first and second members of clamp 48. First and second members, 48a and 48b, may be fastened by any of a number of methods known in the art. Apertures 45 may be provided within members 48a and 48b to accommodate the fastening of the two parts. FIG. 4B illustrates a perspective view of the pivot assembly depicted in FIG. 4A.

Figure 5:
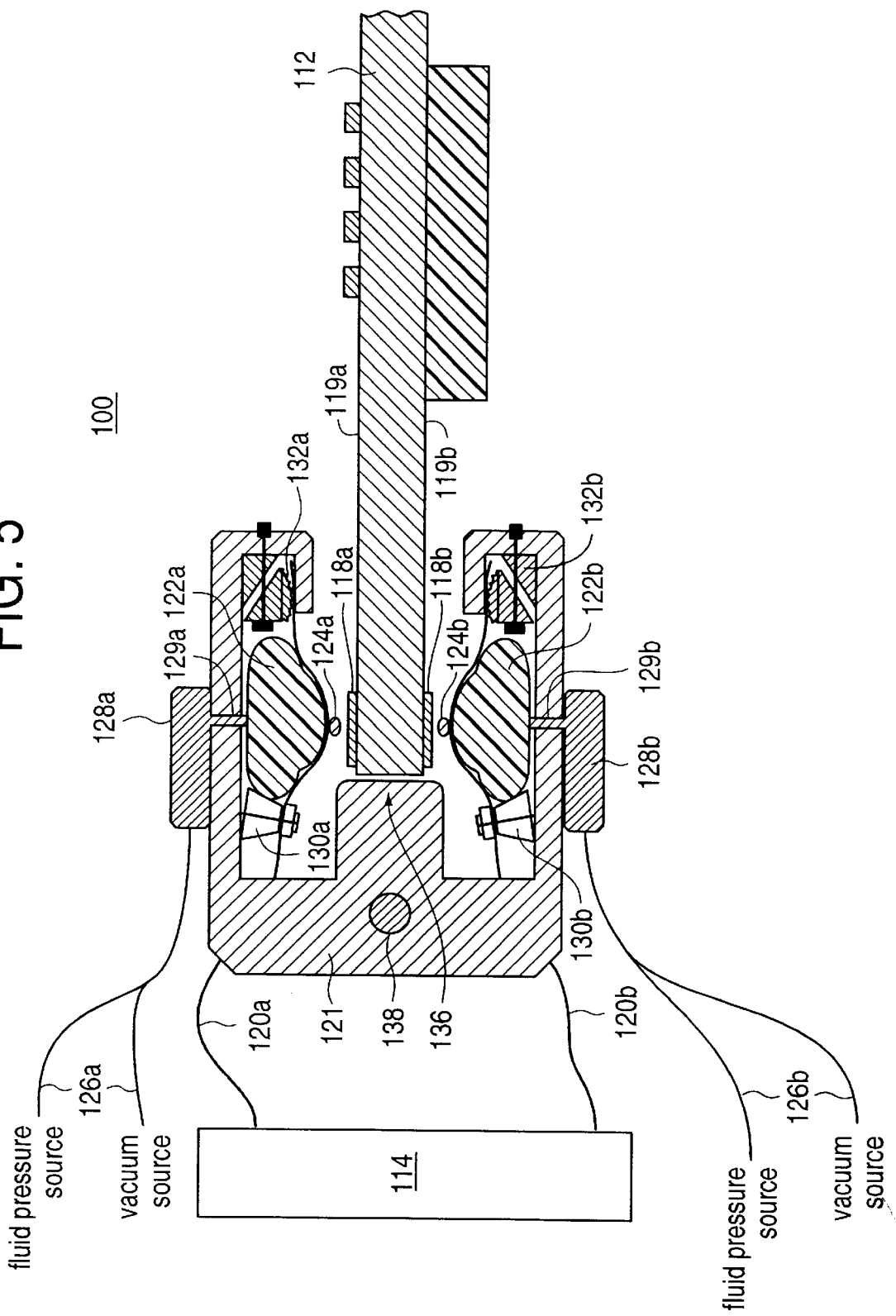
FIG. 5 illustrates another embodiment of the present invention.

FIG. 5 illustrates another zero insertion force connector of the present invention. Connector 100 is adapted to connect a PCB 112 having two sets of contact pads, 118a and 118b, to an electrical device 114. As illustrated, contacts 118a and 118b are positioned along an edge of external surfaces 119a and 119b of PCB 112. Connector 100 includes a support frame/housing 121 with an opening that accommodates the insertion of PCB 112 into the housing chamber. In order to accomplish electrical interconnection between circuit board contact pads 118a and 118b with electrical device 114, connector 100 utilizes two flexible circuits 120a and 120b. Each flexible circuit includes a plurality of contact elements 124a and 124b that are attached to the conductive circuitry or metal layer(s) of the flexible circuit. As shown in FIG. 5, contact elements 124a and 124b protrude from one side of their respective flexible circuits and are aligned over contact pads 118a and 118b, respectively, when PCB 112 is positioned within connector housing 100. Flexible circuits 120a and 120b are secured within the housing by clamps 130a, 130b, 132a and 132b. The manner in which contact elements 124a and 124b engage and disengage contact pads 118a and 188b is similar to the engagement and disengagement methods described in conjunction with the embodiment of FIGS. 1A and 1B. Fluid pressure is supplied to expandable bladder 122a through tubing 126a, manifold 128a and passage 129a. Similarly, fluid pressure is imported to bladder 122b through tubing 126b, manifold 128b and passage 129b. As discussed above, other fluid pressure delivery arrangements may be used Housing 121 also contains a pivot 138 that facilitates the alignment of connector 100 and PCB 112 during the insertion and subsequent engagement of the PCB with the connector. A hardstop 136 is provided within housing 121 to aid in the alignment of the circuit board contacts 118a and 118b with contact elements 124a and 124b, respectively. Further alignment may be achieved in the manner described above in conjunction with the embodiment of FIGS. 1A and 1B. A vaccum pump or other vacuum source may be coupled to bladders 122a and 122b to cause the flexible circuit contact elements 124a and 124b to completely withdraw from pads 118a and 118b during the disengagement thereof.

Figure 6:
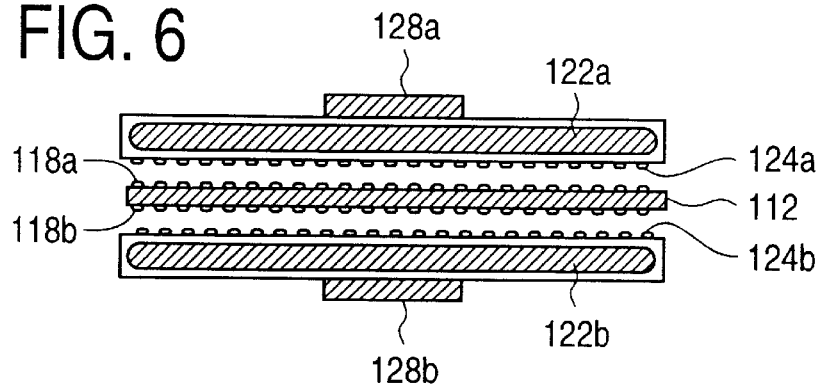
FIG. 6 illustrates a front view of an electrical connector and PCB as illustrated in the embodiment of FIG. 5 wherein the connector is in a fully disengaged position.

FIG. 6 shows a cross-sectional end view of connector 100 depicted in FIG. 5. PCB 112 is shown residing within the connector with flexible circuit contact elements 124a and 124b aligned with their respective circuit board contact pads 118a and 118b.

Figure 7:
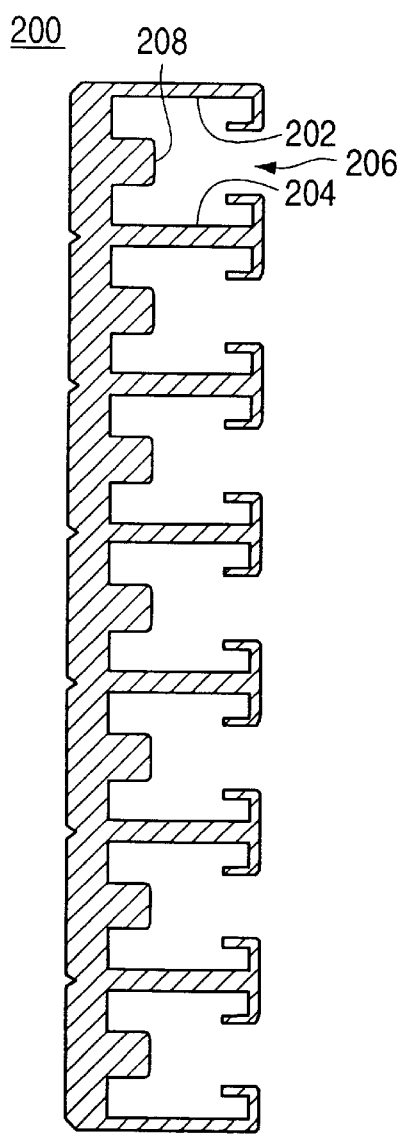
FIG. 7 illustrates a side view of a housing/frame that me be used in the implementation of a multiple connector assembly.

With reference to FIG. 7, a support frame/housing assembly 200 for accommodating a plurality of zero insertion force edge connector assemblies is shown. Each housing unit includes an opening 206 and internal facing walls 202 and 204. A protruding member 208 is provided to form the connector hardstop. The housing assembly is preferably extruded, molded or machined of an electrically insulative material such as plastic. Other materials, such as for example, ceramics may also be used. Housing assembly 200 is provided for illustrative purposes only and may be modified to accommodate any of a number of zero insertion force connectors of the present invention.

Figure 8:
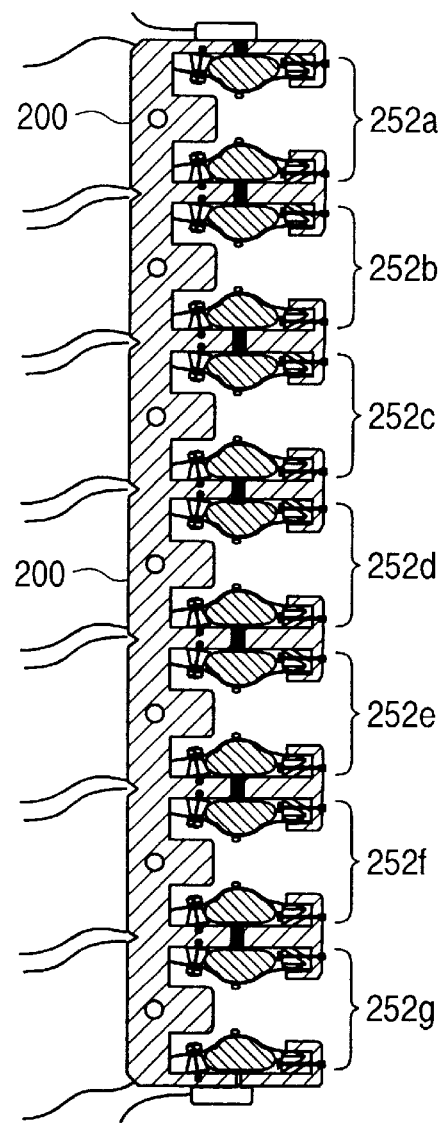
FIG. 8 illustrates a side view of a multiple connector/socket assembly in one embodiment of the present invention.

FIG. 8 illustrates a side view of multiple zero insertion force connectors 252a–252g that are housed within the housing assembly 200 of FIG. 7. In accordance with the present invention, a plurality of circuit boards may be connected to an electrical device, such as a tester, via a plurality of connectors. As a result, the printed circuit boards may be tested either individually, simultaneously, or in accordance with other desired testing schemes.

Figure 9:
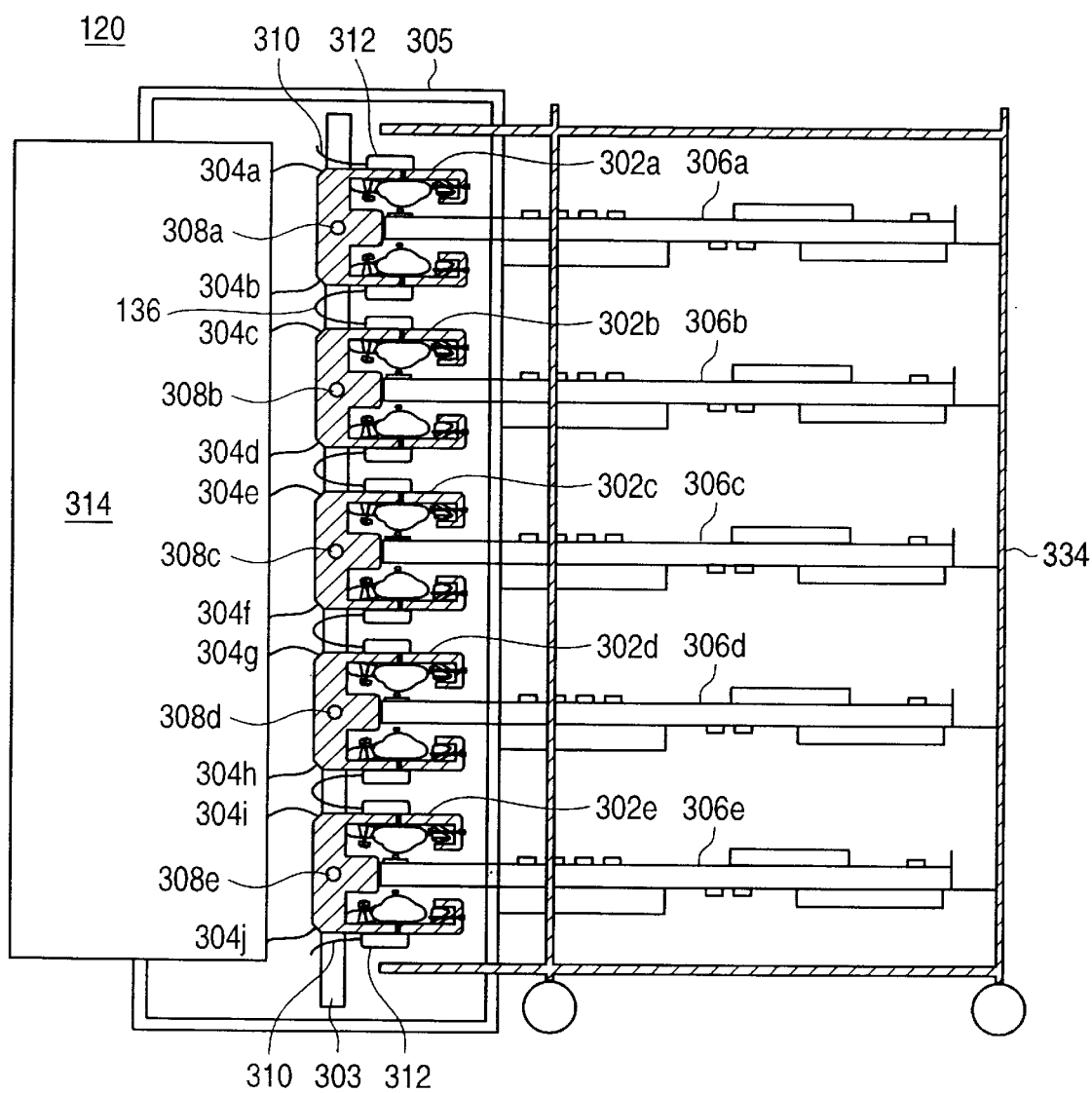
FIG. 9 illustrates a side view of a connector/socket assembly of one embodiment of the present invention having printed circuit boards horizontally mounted within the socket assembly.

FIG. 9 shows yet another manner in which the present invention may be implemented. As shown, a plurality of individual connector assemblies 302a–302e are pivotally attached to a frame member 303 at pivots 308a–308e. Frame member 303 may be located within a housing 305. Connectors 302a–302e are electrically coupled to a tester 314, or other electrical device, via flexible circuits 304a–304j. Printed circuit boards 306a–306e are supported within a trolley 334 and are inserted into their respective connectors by moving the trolley into position with the connector apparatus. Fluid pressure tubing 310 and manifolds 312 are provided to supply fluid pressure to the connector bladders. Robotics or other positioning equipment known in the art may be used in lieu of a trolley to insert and remove the circuit boards from connectors 302a–302e.

Figure 10A:
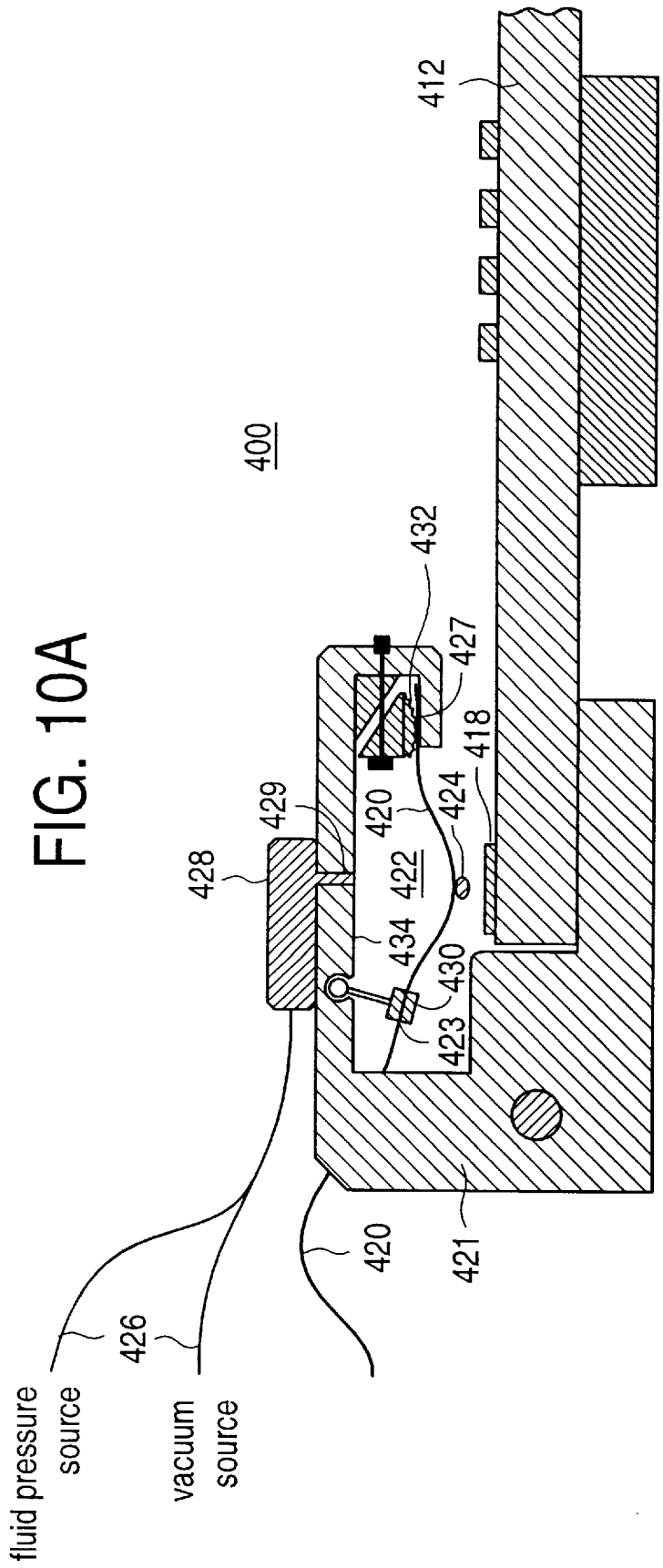
FIG. 10A illustrates a side view of another embodiment of the present invention in a disengaged position.
Figure 10B:
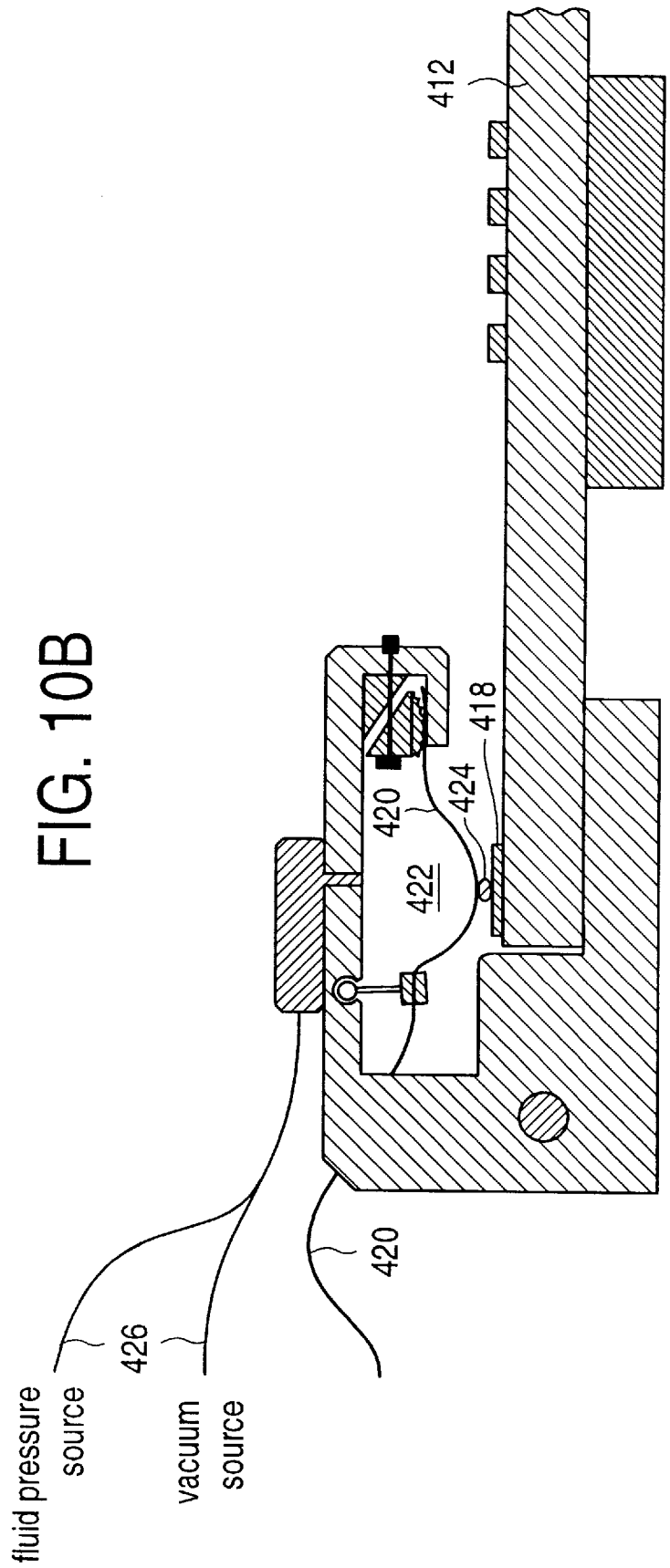
FIG. 10B illustrates the connector/socket of FIG. 10A with the connector contact elements engaged with the printed circuit board contact pads.

FIG. 10A illustrates a zero insertion force connector 400 in yet another embodiment of the present invention. In accordance with the present invention, connector 400 utilizes a flexible circuit 420 having contact elements 424 attached to and protruding from one side of the circuit. Connector 400 includes a housing 421 that possesses an opening for accomodating the insertion of PCB 412 into the connector. The connector includes a flexible circuit 420 that may be connected to an external electrical device at one end and is secured within the connector housing at first and second sections 423 and 427 along its other end. Section 427 is fixed within the housing and is secured by a wedge clamp 432 or other clamping device. Section 423 is attached to a pivot clamp 430 which allows flexible circuit 420 to move within the housing 421 to effect the engagement of contact elements 424 with the contact pads 418 of PCB 412. A sealed cavity 422 is formed between an inner wall 434 of housing 421 and flexible circuit 420. A fluid pressure source is coupled to cavity 422 through tubing 426, manifold 428 and passage 429. The contact elements 424 of flexible circuit 420 are physically engaged with the circuit board contacts 418 by introducing a pressurized fluid, gas or air into cavity 422 to expand flexible circuit 420. Other pressurized fluid delivery methods may also be used. FIG. 10A shows connector 400 in a disengaged position. FIG. 10B shows connector 100 in an engaged position wherein the contact elements 424 of flexible circuit 420 are in physical contact with circuit board pads 418. A vaccum pump or other vacuum source may be coupled to cavity 422 to cause the flexible circuit contact elements 424 to completely withdraw from pads 418 during the disengagement thereof. It is appreciated that a vacuum source is not required in the implementation of the invention.

Thus, an apparatus and method that provides an electrical connection between a test apparatus, or other electrical device, and the contact pads of a printed circuit board is described. Although many alternations and modifications to the present invention will no doubt become apparent to the person of ordinary skill in the art after having read the foregoing description, it is to be understood that the particular embodiments shown and described by way of illustration are in no way intended to be limiting. It is further understood that the relative dimensions, geometric shapes, materials and process parameters set forth within the specification are exemplary of the disclosed embodiments only. Other embodiments may utilize different dimensions, shapes, materials, and process steps, etc., to achieve substantially the same results.

What is claimed is:

1. An electrical connector for a circuit board having a plurality of electrical contacts, said connector comprising:
   a flexible circuit having a first side and an opposite second side, said flexible circuit having a plurality of electrically conductive bumps protruding from said first side, said flexible circuit being secured at a first point and a second point, said first point being fixed, said second point pivoting about an axis of rotation; and
   means for applying a force to said second side of said flexible circuit to physically engage said bumps of said flexible circuit with said contacts of said circuit board, said flexible circuit pivoting about said axis of rotation during said engagement such that said bumps mechanically scrub said contacts of said circuit board.

2. The connector of claim 1 wherein said force means comprises an expandable bladder that is coupled to a fluid pressure means, said fluid pressure means expanding said bladder to effect said engagement of said bumps and circuit board contacts.

3. The connector of claim 2 further comprises means for drawing a vacuum on said bladder to cause said bladder to contract to effect a disengagement of said bumps and said circuit board contacts.

4. An assembly for electrically coupling an electrical device to a contact pad on a printed circuit board, said assembly comprising:
   a flexible circuit coupled to said electrical device, said flexible circuit being secured at a first point and a second point, said first point being fixed, said second point pivoting about an axis of rotation, said flexible circuit comprising at least one metal layer and at least one electrically conductive protuberance attached to said metal layer, said protuberance extending substantially perpendicular from said metal layer; and
   means for physically engaging said protuberance with said contact pad.

* * * * *